United States Patent [19]

Taylor

[11] Patent Number: 5,030,846
[45] Date of Patent: Jul. 9, 1991

[54] ZENER DIODE DETECTOR CIRCUIT

[75] Inventor: James L. Taylor, Malvern, England

[73] Assignee: The Secretary of State for Defence in Her Britannic Majesty's Government of the United Kingdom of Great Britain and Northern Ireland, London, England

[21] Appl. No.: 380,436

[22] Filed: Jul. 17, 1989

Related U.S. Application Data

[63] Continuation of PCT GB88/00178 filed Mar. 9, 1988, published as WO88/07286 on Sep. 22, 1988.

[30] Foreign Application Priority Data

Mar. 9, 1987 [GB] United Kingdom ............... 8705429

[51] Int. Cl.⁵ .................... H03K 5/00; H03K 3/26; G06G 7/12
[52] U.S. Cl. ..................... 307/261; 307/318; 307/494; 328/26; 328/28
[58] Field of Search ............... 307/261, 270, 493, 494, 307/318; 328/26, 32, 28

[56] References Cited

U.S. PATENT DOCUMENTS 4,647,861 3/1987 Petritis et al. ............... 307/261
4,665,372 5/1987 Schwartz .................. 307/261

FOREIGN PATENT DOCUMENTS 0640213 3/1964 Belgium .................... 307/261

Primary Examiner—Stanley D. Miller
Assistant Examiner—Trong Phan
Attorney, Agent, or Firm—Nixon & Vanderhye

[57] ABSTRACT

A rectifier circuit comprises two Zener diodes (3,4) having substantially the same characteristic Zener voltage which are connected to receive a sinusoidal input signal via a low impedance buffer (8). A half-wave rectified signal appearing on line (17) has a DC bias equal to the Zener voltage which is removed by the operational amplifier (15). A low pass filter (20) provides a smoothed DC voltage output on line (21). The circuit may be used as an AC to DC converter or for the detection of signals ranging from several volts down to a few millivolts. Its linear response over a wide dynamic range and at small signal levels is an advantage over conventional silicon diode rectifier circuits which suffer distortion at low signal levels.

6 Claims, 2 Drawing Sheets

ZENER DIODE DETECTOR CIRCUIT

This application is a continuing application under 35 USC 363 of International Application No. PCT/GB88/00178, filed 9 Mar. 1988, published as WO88/07286 on Sep. 22, 1988.

BACKGROUND OF THE INVENTION

1. Field of the Invention

This invention relates to electrical rectifying circuits which may be useful in, for example, AC measurement systems or employable as AC to DC voltage converters or as signal dectectors.

2. Discussion of Prior Art

Known methods of signal detection employ at least one semi-conductor junction diode, usually a silicon diode. One disadvantage, which the silicon diode has, is its negligible response below the cut-in voltage. (This is approximated 0.6V at 20° C.). Consequently, its performance as a rectifier or detector is grossly non-linear for small signal voltages. Diode sensitivity may be increased by the known method of incorporating it within the feedback loop of an operational amplifier, which effectively reduces the cut-in voltage almost to zero. However, the linearity of such a circuit as an AC to DC converter suffers at low signal levels due to distortion.

SUMMARY OF THE INVENTION

The present invention seeks to provide a rectifier circuit for the detection of signals ranging from a few millivolts up to several volts. It also seeks to provide a rectifier having a linear response over this dynamic range.

A further object of the invention is to provide a rectifier circuit which is substantially lossless and free from distortion over a wide range of operating frequencies.

According to the present invention a half-wave rectifier circuit comprises a first Zener diode having a characteristic Zener voltage and arranged to be reverse-biased and conducting at all times and having a first electrode for connection to a sinusoidal input signal and a second electrode connected to an electrode of the same polarity of a second Zener diode, the second Zener diode being reverse biased and having substantially the same characteristic Zener voltage as the first Zener diode.

Preferably, the input signal is connected to the first Zener diode via a buffer having a very low output impedance. The buffer may comprise a first operational amplifier having 100% feedback and operating as an ideal emitter-follower.

The half-wave rectified signal which appears at the junction of the first and second Zener diodes will have a DC bias equal to the characteristic Zener voltage. This bias may be removed and the signal restored to ground level by incorporating an optional feature of the invention comprising a second operational amplifier having a third Zener diode in its feedback loop. Preferably, this third Zener diode has the same Zener voltage as the first and second Zener diodes.

The restored half-wave rectified output signal from the second operational amplifier may be smoothed by passing it through a low-pass filter.

Choosing a first Zener diode with a characteristic Zener voltage equal to that of the second ensures minimum distortion of the half-wave rectified signal. However, in practice, it is difficult to obtain a perfectly matched pair but small variations may be corrected by using an offset-null adjustment on the first operational amplifier to optimise the performance of the circuit in this respect.

Preferably, the Zener diodes have a very sharp knee in the reverse bias voltage condition.

The invention has the advantage of being simple in construction.

BRIEF DESCRIPTION OF THE DRAWINGS

The invention will now be described with reference to the drawings of which.

DETAILED DESCRIPTION OF PREFERRED EMBODIMENTS

Figure 1:
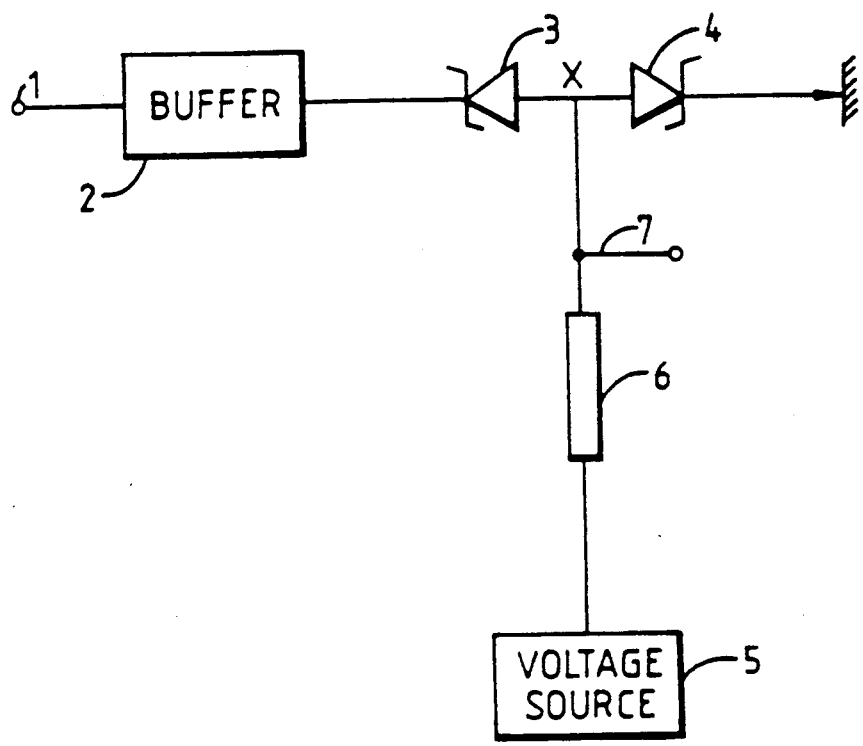
FIG. 1 shows a basic circuit in accordance with the invention.

Referring to FIG. 1 a sinusoidal signal referenced to ground level is applied at input line 1 to a buffer 2. The buffer 2 has unity gain and a low output impedance. Two Zener diodes 3, 4 are held in reverse bias by a voltage source 5 and a current limiting resistor 6. In this particular embodiment, the voltage source 5 is chosen to be −15V and the diodes 3, 4 are chosen to have a Zener voltage of 9.1V.

A convenient value for resistor 6 is 20. There will always be 9.1V across the diode 3, so that as the cathode of diode 3 rises and falls as a result of input signal variations, its anode will attempt to follow by the same amount and if the diode 4 were not connected, the voltage appearing at point X would be a replica of the input signal biased by −9.1V. However, when diode 4 is connected as shown in FIG. 1 and the input signal falls below ground level, the diode 4 will conduct and clamp point X to −9.1V. At all other times, the diode 4 cannot conduct and hence a positive-going half-sine-wave rectified signal biased by −9.1V appears at output 7. The peak value of the half-sine-wave signal is the same as the peak value of the input signal.

It will be apparent to those skilled in the art that other choices of Zener voltage and source voltage are permissible for a given peak voltage level of the input signal, provided that the diodes 3, 4 have a sharp cut-off when reverse biased and that the diode 3 is always reverse biased and conducting.

A negative-going half-wave rectified signal may be obtained if the voltage source 5 has a positive value and the connections to the diodes 3, 4 are reversed. In this case the DC bias on the output signal at point 7 will be +9.1V.

Figure 2:
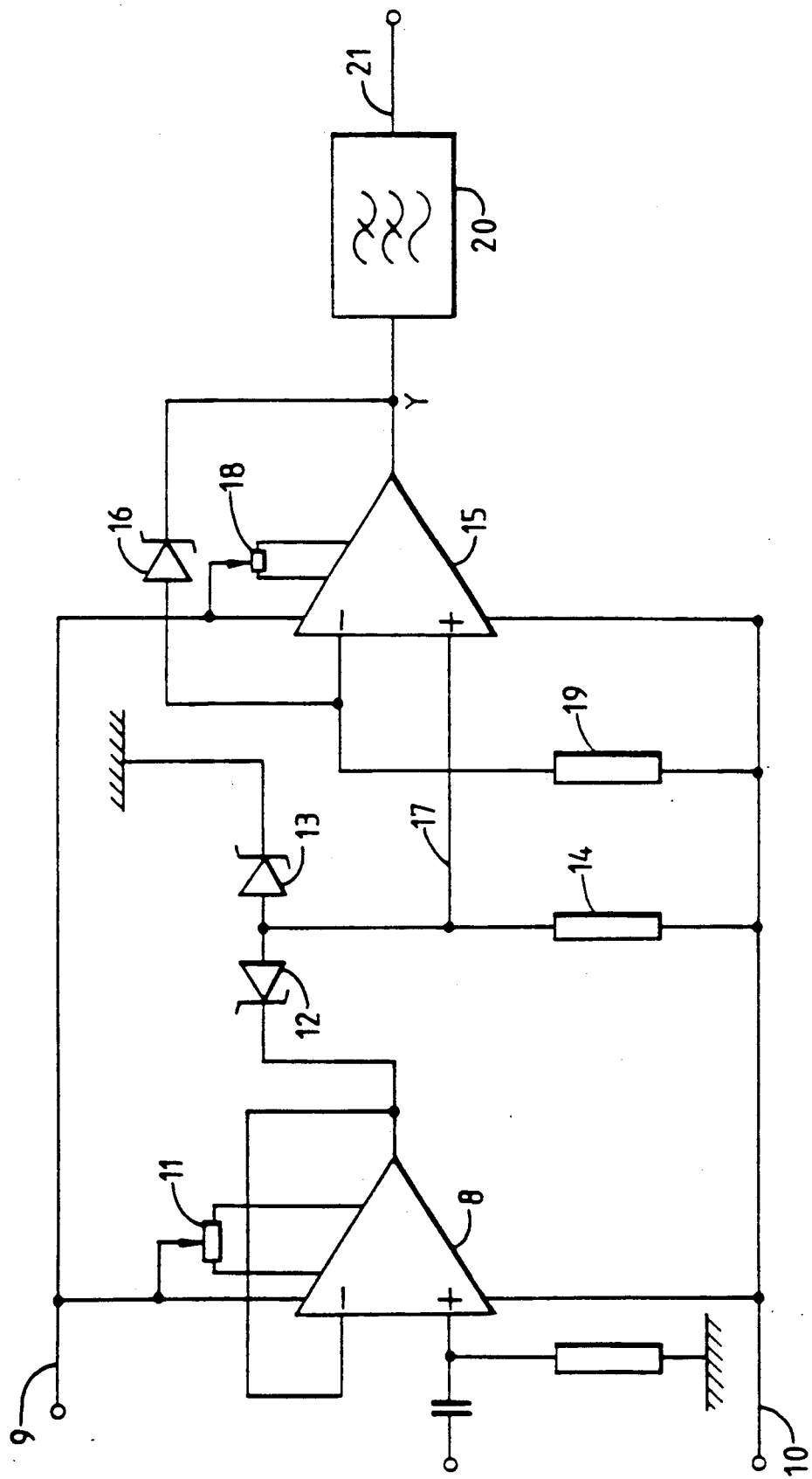
FIG. 2 shows the invention in more detail incorporating preferred features.

In FIG. 2, an operational amplifier 8 fulfils the function of a buffer and is powered by positive and negative supply lines 9 and 10 of +15V and −15V respectively. A sinusoidal signal is applied to the non-inverting input of the amplifier 8 and an offset-null control 11 allows matching of two Zener diodes 12, 13. Matching of the diodes 12, 13 is best carried out at a low input signal level of a few tens of millivolts. A resistive element 14 is a constant current diode having a nominal operating current of 0.56mA. This element 14 ensures that the minimum current passing through the diodes 12, 13 is not less than that required for their stable operation. A second operational amplifier 15 and a third Zener diode 16 remove the DC bias of −9.1V from the signal on line 17. The offset-null control 18 is used to restore the DC base-level of the rectified signal at point Y to exactly zero. Current through the diode 16 is limited by a second constant current diode 19 (also having a nominal operating current of 0.56mA). The output of the amplifier 15 is finally fed into a low-pass filter 20 which provides a smoothed DC voltage level on line 21 which is linearly related to the input down to signal levels of a few millivolts.

All Zener dioes 12, 13, 16 are mounted in contact with a heat sink and have a Zener voltage of 9.1V.

Figure 3:
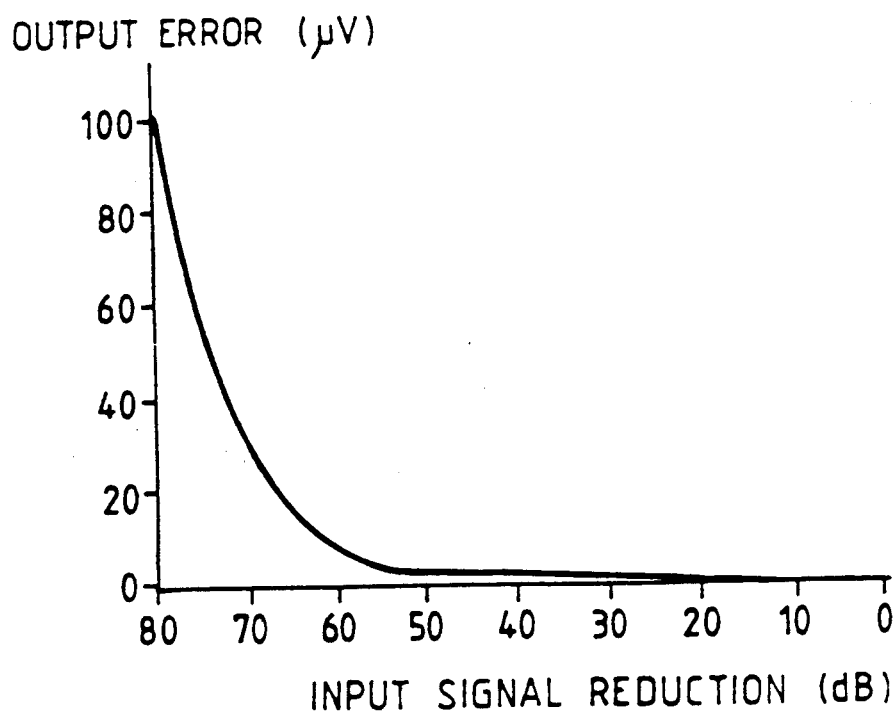
FIG. 3 shows a graph illustrating the performance of the invention.

The performance of a circuit substantially as illustrated in FIG. 2 has been tested using a 1 kHz sine-wave input signal which was varied over a dynamic range of 80dB. This circuit proved to behave substantially linearly over a dynamic range of 60dB. Such performance cannot be achieved using conventional semi-conductor diode detection techniques. FIG. 3 shows a plot of the input signal versus the error in the output signal. (OdB corresponds to 6.283V). Further tests showed that the invention will perform satisfactorily up to frequencies of several MHz.

What is claimed is:

1. A half-way rectifier circuit for rectifying an input signal, said input signal being sinusoidal about a first reference voltage, said rectifier circuit comprising:
   means for generating said reference voltage;
   first and second Zener diodes each of said Zener diodes having the same characteristic Zener voltage as the other, said first Zener diode having a first electrode for connection to said input signal, said second Zener diode having a first electrode maintainable at said reference voltage, said first Zener diode having a second electrode, said second Zener diode having a second electrode connected to and having the same polarity as said second electrode of said first Zener diode; and
   a voltage source, connected to said second electrodes, comprising a means for reverse biasing said first and second Zener diodes and for permitting said first Zener diode to conduct at all times and said second Zener diode to conduct only on alternate half-cycles of said input signal.

2. A half-wave rectifier circuit as claimed in claim 1 further including a buffer connected between the input signal and the first electrode of the first Zener diode, said buffer including means for adjusting a potential at the first electrode of the first Zener diode relative to said reference voltage in order to compensate for any relative variation in characteristic Zener voltage between the two Zener diodes.

3. A half-wave rectifier circuit as claimed in claim 1 further including an electric circuit for removing any DC bias from a half-wave rectified signal appearing on the second electrodes of the first and second Zener diodes, said electric circuit incorporating:
   a third Zener diode having a first electrode, a second electrode and substantially the same characteristic Zener voltage as the first and second Zener diode; and
   a buffer interconnecting said second electrodes and a first electrode of the third Zener diode,
   said buffer including means for adjusting the potential at said first electrode of the third Zener diode for precise matching of the characteristic Zener voltage of said third Zener diode with a DC bias of said half-wave rectified signal.

4. A half-wave rectifier circuit as claimed in claim 3 in which the electric circuit has its output connected to a low-pass filter.

5. A half-wave rectifier circuit as claimed in claim 2 further including an electric circuit for removing any DC bias from a half-wave rectified signal appearing on the second electrodes of the first and second Zener diodes, said electric circuit incorporating:
   a third Zener diode having a first electrode, a second electrode and substantially the same characteristic Zener voltage as the first and second Zener diodes; and
   a buffer interconnecting said second electrodes and a first electrode of the third Zener diode,
   said buffer including means for adjusting the potential at said first electrode of the third Zener diode for precise matching of the characteristic Zener voltage of said third Zener diode with a DC bias of said half-wave rectified signal.

6. A half-wave rectifier circuit as claimed in claim 5 in which the electric circuit has its output connected to a low-pass filter.

* * * * *